US012740113B2

(12) United States Patent
Raghunathan et al.

(10) Patent No.: US 12,740,113 B2
(45) Date of Patent: Sep. 15, 2026

(54) BIPOLAR TRANSISTOR STRUCTURES WITH CAVITY BELOW EXTRINSIC BASE AND METHODS TO FORM SAME

(71) Applicant: GlobalFoundries U.S. Inc., Malta, NY (US)

(72) Inventors: Uppili S. Raghunathan, Essex Junction, VT (US); Alexander M. Derrickson, Saratoga Springs, NY (US); Sarah A. McTaggart, Essex Junction, VT (US); Judson Robert Holt, Ballston Lake, NY (US); Vibhor Jain, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 432 days.

(21) Appl. No.: 18/481,632

(22) Filed: Oct. 5, 2023

(65) Prior Publication Data

US 2025/0120144 A1 Apr. 10, 2025

(51) Int. Cl.

*H10D 62/17* (2025.01)
*H10D 10/01* (2025.01)
*H10D 62/10* (2025.01)
*H10D 62/13* (2025.01)

(52) U.S. Cl.

CPC ........... *H10D 62/184* (2025.01); *H10D 10/01* (2025.01); *H10D 10/054* (2025.01); *H10D 10/061* (2025.01); *H10D 62/115* (2025.01); *H10D 62/134* (2025.01)

(58) Field of Classification Search

CPC .. H10D 62/184; H10D 10/061; H10D 62/134; H10D 10/021; H10D 62/177; H10D 62/115

See application file for complete search history.

(56) References Cited

U.S. PATENT DOCUMENTS

| | | | |
|---|---|---|---|
| 5,516,710 | A | 5/1996 | Boyd et al. |
| 6,869,852 | B1 | 3/2005 | Joseph et al. |
| 6,940,149 | B1 | 9/2005 | Divakaruni et al. |
| 6,964,907 | B1 | 11/2005 | Hopper et al. |
| 7,214,593 | B2 | 5/2007 | Coolbaugh et al. |
| 7,462,923 | B1 | 12/2008 | U'Ren |
| 7,709,338 | B2 | 5/2010 | Liu et al. |

(Continued)

FOREIGN PATENT DOCUMENTS

| | | | |
|---|---|---|---|
| DE | 10042343 | A1 | 3/2002 |
| DE | 102015208133 | B3 | 8/2016 |
| EP | 4235796 | A1 | 8/2023 |

OTHER PUBLICATIONS

U.S. Appl. No. 18/751,428, filed Jun. 24, 2024, 41 pages.

(Continued)

*Primary Examiner* — Matthew L Reames
(74) *Attorney, Agent, or Firm* — Francois Pagette; Hoffman Warnick LLC

(57) ABSTRACT

The disclosure provides bipolar transistor structures with a cavity below an extrinsic base, and methods to form the same. A structure of the disclosure provides a bipolar transistor structure including an extrinsic base protruding from an intrinsic base of a bipolar transistor. The extrinsic base extends over a cavity. An insulator is horizontally adjacent the cavity and below a portion of the extrinsic base. A collector extension region of the bipolar transistor structure extends laterally below the insulator and the cavity.

20 Claims, 16 Drawing Sheets

(56) References Cited

U.S. PATENT DOCUMENTS

| | | | |
|---|---|---|---|
| 7,750,371 | B2 | 7/2010 | Gluschenkov et al. |
| 7,846,805 | B2 | 12/2010 | Zhang et al. |
| 7,883,954 | B2 | 2/2011 | Magnee et al. |
| 7,952,165 | B2 | 5/2011 | Cohen et al. |
| 8,067,290 | B2 | 11/2011 | Boeck et al. |
| 8,395,217 | B1 | 3/2013 | Cheng et al. |
| 8,405,127 | B2 | 3/2013 | Chu et al. |
| 8,558,282 | B1 | 10/2013 | Cai et al. |
| 8,853,043 | B2 | 10/2014 | Hodge et al. |
| 9,029,229 | B2 | 5/2015 | Adkisson et al. |
| 9,070,734 | B2 | 6/2015 | Camillo-Castillo et al. |
| 9,093,491 | B2 | 7/2015 | Adkisson et al. |
| 9,159,817 | B2 | 10/2015 | Camillo-Castillo et al. |
| 9,202,900 | B2 | 12/2015 | Adkisson et al. |
| 9,240,448 | B2 | 1/2016 | Adkisson et al. |
| 9,245,951 | B1 | 1/2016 | Camillo-Castillo et al. |
| 9,318,551 | B2 | 4/2016 | Camillo-Castillo et al. |
| 9,368,608 | B1 | 6/2016 | Camillo-Castillo et al. |
| 9,508,824 | B2 | 11/2016 | Fox et al. |
| 9,570,564 | B2 | 2/2017 | Alperstein et al. |
| 9,583,569 | B2 | 2/2017 | Camillo-Castillo et al. |
| 9,653,566 | B2 | 5/2017 | Camillo-Castillo et al. |
| 9,673,294 | B2 | 6/2017 | Tschumakow et al. |
| 9,812,369 | B2 | 11/2017 | Hoffmann et al. |
| 10,115,810 | B2 | 10/2018 | Liu et al. |
| 10,186,605 | B1 | 1/2019 | Gauthier et al. |
| 10,211,090 | B2 | 2/2019 | Stamper et al. |
| 10,224,423 | B1 | 3/2019 | Gauthier et al. |
| 10,312,356 | B1 | 6/2019 | Liu et al. |
| 10,707,336 | B1 | 7/2020 | Hashemi et al. |
| 10,818,772 | B2 | 10/2020 | Jain et al. |
| 11,063,139 | B2 | 7/2021 | Jain et al. |
| 11,145,741 | B2 | 10/2021 | Gauthier et al. |
| 11,362,201 | B1 | 6/2022 | McTaggart et al. |
| 12,342,555 | B1 | 6/2025 | Raghunathan et al. |
| 2001/0017399 | A1 | 8/2001 | Oda et al. |
| 2003/0109109 | A1 | 6/2003 | Freeman et al. |
| 2004/0256635 | A1 | 12/2004 | Saitoh et al. |
| 2008/0179632 | A1 | 7/2008 | Adam et al. |
| 2011/0198671 | A1 | 8/2011 | Boccardi et al. |
| 2013/0214275 | A1 | 8/2013 | Adkisson et al. |
| 2015/0008558 | A1 | 1/2015 | Harame et al. |
| 2015/0008559 | A1 | 1/2015 | Camillo-Castillo et al. |
| 2015/0137185 | A1 | 5/2015 | Camillo-Castillo et al. |
| 2015/0137186 | A1 | 5/2015 | Leidy et al. |
| 2016/0190292 | A1 | 6/2016 | Adkisson et al. |
| 2021/0036122 | A1 | 2/2021 | Wong et al. |
| 2021/0257454 | A1 | 8/2021 | Adusumilli et al. |
| 2021/0273082 | A1 | 9/2021 | Brezza et al. |
| 2022/0013654 | A1 | 1/2022 | Gauthier et al. |
| 2023/0131166 | A1 | 4/2023 | Kirchgessner et al. |
| 2023/0187527 | A1 | 6/2023 | John et al. |
| 2023/0230877 | A1 | 7/2023 | Chung et al. |
| 2024/0079473 | A1 | 3/2024 | John et al. |

OTHER PUBLICATIONS

U.S. Appl. No. 18/905,278, filed Oct. 3, 2024, 47 pages.

U.S. Appl. No. 18/945,645, filed Nov. 13, 2024, 45 pages.

U.S. Appl. No. 18/967,735, filed Dec. 4, 2024, 44 pages.

U.S. Appl. No. 19/045,068, filed Feb. 4, 2025, 60 pages.

U.S. Appl. No. 19/086,225, filed Mar. 21, 2025, 52 pages.

U.S. Appl. No. 18/945,645, Notice of Allowance dated Jul. 16, 2025, 10 pages.

U.S. Appl. No. 19/303,461, filed Aug. 19, 2025, 47 pages.

Knoops et al., "Status and prospects of plasma-assisted atomic layer deposition," Research Article, Journal of Vacuum Science and Technology A 37, Mar. 18, 2019, 27 pages.

Mitchell, "The Role of the Silicon Germanium (SiGe) Heterojunction Bipolar Transistor (HBT) in Mobile Technology Platforms," Army Research Laboratory, ARL-TN-0459, Sep. 2011, 38 pages.

Jagannathan et al., "Self-Aligned SiGe NPN Transistors With 285 GHz fMAX and fT in a Manufacturable Technology," IEEE Electron Device Letters, vol. 23, No. 5, May 2002, pp. 258-260.

Nguyen et al., "Pinch Off Plasma CVD Deposition Process and Material Technology for Nano-Device Air Gap/Spacer Formation," ECS Journal of Solid State Science and Technology, 7 (10), published Oct. 16, 2018, p. 588-p. 594.

U.S. Appl. No. 18/945,645, Office Action dated Feb. 12, 2025, 9 pages.

European Search Report for corresponding EP Application No. 25175441.1-1211 dated Oct. 10, 2025, 11 pages.

European Search Report for corresponding EP Application No. 25168190.4-1211 dated Sep. 15, 2025, 11 pages.

Pekarik et al., "A 90nm SiGe BiCMOS Technology for mm-wave and high-performance analog applications," IEEE 2014, downloaded from IEEE Xplore on Sep. 10, 2024, 4 pages.

Vu et al., "Advanced Si/SiGe HBT architecture for 28-nm FD-SOI BiCMOS," IEEE 2016, downloaded from IEEE Xplore on Sep. 10, 2024, 4 pages.

U.S. Appl. No. 18/945,645, De Minimis Amendment to Office Action filed Apr. 30, 2025, 8 pages.

European Search Report for corresponding EP Application No. 24217336.7-1211 dated May 20, 2025, 9 pages.

BIPOLAR TRANSISTOR STRUCTURES WITH CAVITY BELOW EXTRINSIC BASE AND METHODS TO FORM SAME

BACKGROUND

The present disclosure provides a bipolar structure transistor with a cavity below an extrinsic base and methods to form the same.

Present technology is at atomic level scaling of certain micro-devices such as logic gates, bipolar transistors, field effect transistors (FETs), and capacitors. Circuit chips with millions of such devices are common. The structure of a bipolar transistor defines several of its properties during operation. Resistance across the base of a bipolar transistor, in particular, may affect properties such as maximum frequency and signal noise. Resistance may be undesirably high in bipolar transistors featuring an in-situ doped extrinsic base formed of polycrystalline silicon ("polysilicon"), especially when such a structure is on top of a layer of dielectric material.

SUMMARY

The illustrative aspects of the present disclosure are designed to solve the problems herein described and/or other problems not discussed.

Embodiments of the disclosure provide a structure including: a bipolar transistor structure including an extrinsic base protruding from an intrinsic base of the bipolar transistor structure and extending over a cavity; and an insulator horizontally adjacent the cavity and below a portion of the extrinsic base such that the insulator is below the notch, wherein a collector extension region of the bipolar transistor structure extends laterally below the insulator and the cavity.

Other embodiments of the disclosure provide a structure including: a vertical bipolar transistor structure including: a collector on a substrate, an intrinsic base on the collector, an extrinsic base protruding from the intrinsic base, and extending over a cavity, wherein an upper surface of the extrinsic base includes a notch, and an emitter on a portion of the intrinsic base; and an insulator horizontally adjacent the cavity and below a portion of the extrinsic base such that the insulator is below the notch, wherein a collector extension region of the bipolar transistor structure extends laterally below the insulator and the cavity.

Additional embodiments of the disclosure provide a method including: forming a bipolar transistor structure including an extrinsic base protruding from an intrinsic base of the bipolar transistor structure and extending over a cavity; and forming an insulator horizontally adjacent the cavity and below a portion of the extrinsic base such that the insulator is below the notch, wherein a collector extension region of the bipolar transistor structure extends laterally below the insulator and the cavity.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
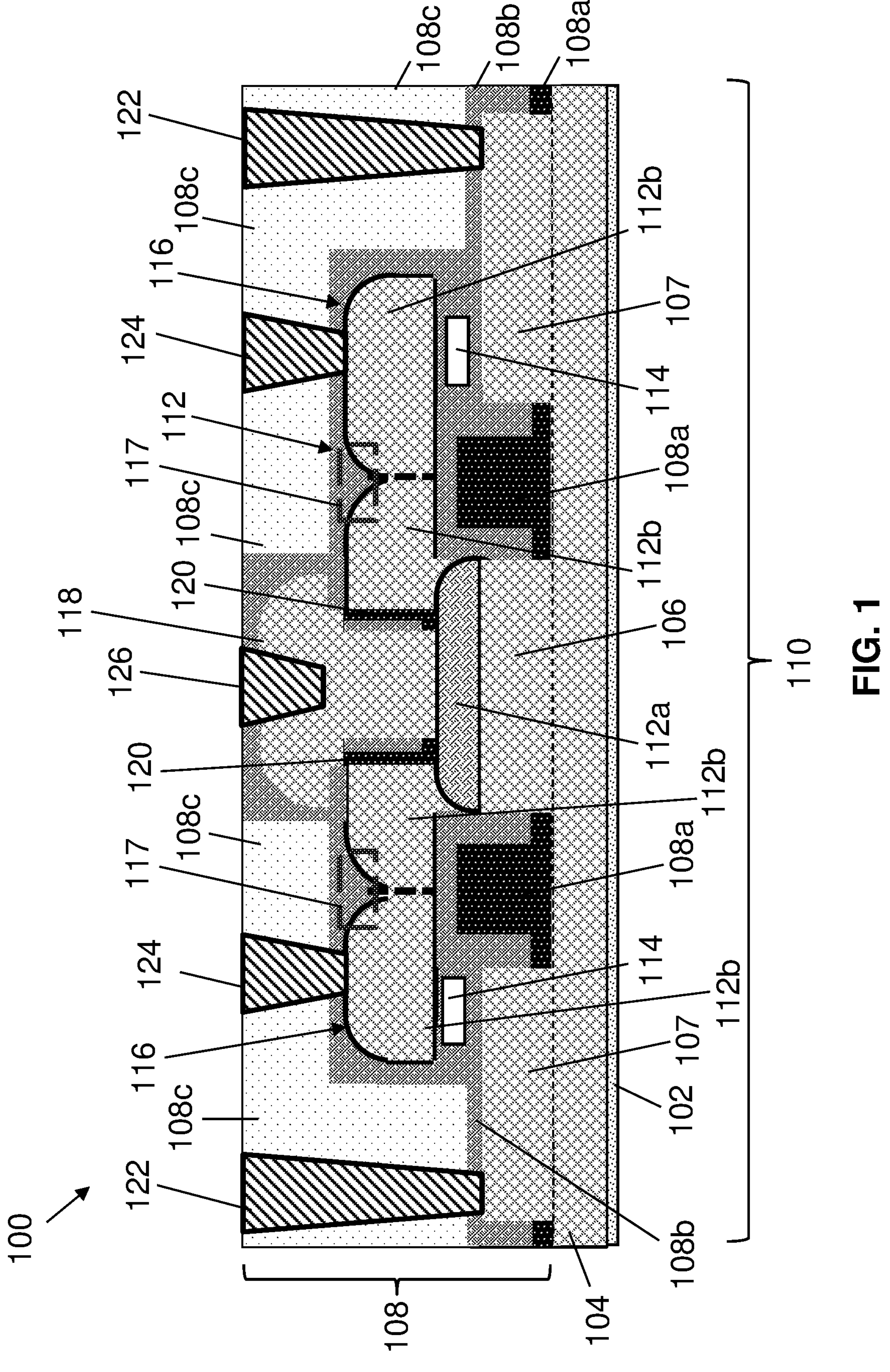
FIG. 1 depicts a cross-sectional view of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

The disclosure provides bipolar transistor structures with a cavity below a monocrystalline extrinsic base, and methods to form the same. A structure of the disclosure provides a bipolar transistor structure including a extrinsic base (e.g., having a monocrystalline semiconductor) protruding from an intrinsic base of a bipolar transistor. The extrinsic base extends over a cavity. An upper surface of the extrinsic base may include a notch. An insulator is horizontally adjacent the cavity and below a portion of the extrinsic base. A collector extension region of the bipolar transistor structure (i.e., an additional region of collector material horizontally distal to the collector) extends laterally below the insulator and the cavity.

Bipolar junction transistor (BJT) structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affects the size of the potential barrier. In the case of a junction between two semiconductor materials, the potential barrier will be formed along the interface between the two semiconductor materials.

Referring to FIG. 1, a structure 100 according to the disclosure may include a bipolar transistor 110 (e.g., a vertically oriented bipolar transistor as discussed herein) and an insulator 108 horizontally adjacent bipolar transistor 110, in which a cavity 114 is below a portion of bipolar transistor 110 and horizontally adjacent insulator 108. Further structural features discussed herein may allow cavity 114 to be adjacent insulator 108 and bipolar transistor 110 and may provide various technical and commercial advantages when included within structure 100. Structure 100 may be formed on a substrate 102 including, e.g., one or more monocrystalline semiconductor materials. Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entirety of substrate 102 may be strained. Substrate 102 may be doped to provide a subcollector 104 (also known as a "doped well" to indicate a lower region of semiconductor material having dopants), e.g., to enable coupling to the lower active semiconductor materials of a vertical bipolar transistor. Subcollector 104 may have any conceivable doping type and/or doping composition appropriate for use within and/or coupling to the collector terminal of a bipolar transistor. For instance, subcollector 104 may have the same dopant type as other portions of substrate 102 (e.g., P type doping), a different doping type, similar or different doping species, and/or may have a higher or lower higher dopant concentration therein.

A collector 106 may be on subcollector 104, e.g., a as a single layer or multiple horizontally separated and distinct layers formed by deposition and/or epitaxial growth of silicon and/or other semiconductor materials on subcollector 104 and may have a predetermined doping type, e.g., by being doped in-situ or during formation of semiconductor material(s) of substrate 102 and/or subcollector 104. Collector 106 may define active semiconductor material of a vertical bipolar transistor, and thus may be vertically below other terminals (i.e., intrinsic base, extrinsic base, and emitter terminals discussed herein) of bipolar transistor 110. Collector extension regions 107 (i.e., additional semiconductor regions having the same doping type and/or composition as collector 106) also be on subcollector 104 to facilitate forming of electrical coupling of collector contacts (contacts 122 discussed herein) to collector 106. In some cases, collector extension regions 107 may be known as "collector contact regions" in the case where one or more contacts are formed thereon. An insulator 108, which may be subdivided into multiple layers and/or materials, may also be on subcollector 104 to horizontally separate various portions of collector 106 from each other but enabling electrical interconnection of each collector 106 through subcollector 104 thereunder.

Insulator 108 may include multiple layers, the composition of which may optionally vary between embodiments. For instance, insulator 108 as shown in FIG. 1 may include a first insulator 108*a* (e.g., a trench isolation (TI) structure and/or other oxide based insulator such as silicon oxide ($SiO2$)) on subcollector 104 on opposing sides of collector 106 (e.g., separating collector 106 from collector extension regions 107) and a second insulator 108*b* on first insulator 108*a* (e.g., a spacer material such as silicon nitride (SiN) or other nitride based insulators). Second insulator 108*b*, where provided, may encapsulate the various components of bipolar transistor 110. A third insulator 108*c* may be on, and adjacent portions of, second insulator 108*b*. Third insulator 108*c* may have the same composition as first insulator 108*a* or may have a different composition, e.g., it may be another layer of SiO2 or any other currently know or later developed middle of line (MEOL) or back end of line (BEOL) insulator materials). In various further implementations, only one of the multiple insulators 108*a*, 108*b*, 108*c* may be used to provide insulator 108. Where each of insulators 108*a*, 108*b*, 108*c* are included, insulator 108 may take the form of an oxide-nitride-oxide ("ONO") stack over substrate 102.

Bipolar transistor 110 may include a base 112 on collector 106. Base 112 may include, e.g., monocrystalline SiGe or any other monocrystalline semiconductor material that is doped to have a predetermined polarity. In the case where the bipolar transistor is an NPN-type transistor and subcollector 104, collector 106, and collector extension region(s) 107 are doped n-type, base 112 may be doped p-type to form a P-N junction, and hence an emitter/collector interface. It is also understood that base 112 may be doped n-type in in the case where the bipolar transistor is a PNP-type transistor. However embodied, base 112 may extend to a predetermined height over collector 106, and as discussed herein base 112 may have a non-planar geometry to allow portions thereof to extend horizontally outward and/or over a cavity 114 defined below portions of base 112 within structure 100.

Base 112 may be subdivided into multiple regions having distinct compositions and/or doping. Some portions of base 112 may be lightly doped or undoped to define an intrinsic base 112*a* and others may be more highly doped to define an extrinsic base 112*b*. According to an example, intrinsic base 112*a* may include monocrystalline silicon germanium (SiGe) with a relatively low amount of doping (e.g., p-type), and extrinsic base 112*b* may include monocrystalline silicon with a relatively high amount of the same doping type (e.g., more p-type doping than intrinsic base 112*a*). Extrinsic bases 112*b* may be located partially over the opposing horizontal ends of intrinsic base 112*a* and may further protrude horizontally outward from the opposing horizontal ends of intrinsic base 112*a* over insulator 108*a* and further over insulator 108*b* so as to partially overlay but be electrically isolated from collector extension regions 107. The shape of intrinsic base 112*a* may arise from being formed by selective epitaxial growth of monocrystalline semiconductor material (e.g., SiGe or Si) on collector region 106 between portions of insulator 108. The shape of extrinsic base 112*b* may arise from being formed by selective epitaxial growth of monocrystalline semiconductor material on exposed semiconductor surfaces such that it further extends over portions of insulator 108 (e.g., portions 108*a*) on opposing sides of collector 106 and intrinsic base 112*a* thereon, during processing as discussed herein. As further discussed herein, extrinsic base 112*b* may have an upper surface 116 with a notch 117 therein. Notch 117 may be a portion of base 112 in which the vertical thickness of extrinsic base 112*b* decreases, defining notch 117 as a valley, divot, depression, and/or other type of vertically inwardly non-lateral section of upper surface 116. Notch 117 may be a physical artifact of various processes to extend the horizontal length of extrinsic base 112*b* and/or to form cavity 114 vertically between collector extension region 107 (and/or in some cases, collector 106) and extrinsic base 112*b* thereover, as discussed herein. Where insulator 108 includes multiple materials (e.g., insulators 108*a*, 108*b*, 108*c*) cavity 114 may be in only one of the multiple materials (e.g., second insulator 108*b* as shown in FIG. 1) but this is not necessarily required. Conductive connections to base 112 may be formed on extrinsic base 112*b* as discussed elsewhere herein, thus allowing electric current applied thereto to influence the conductivity within intrinsic base 112*a* over collector 106.

An emitter 118 may be on intrinsic base 112*a* and may have the same doping type as subcollector 104 and collector 106, and thus, has an opposite doping type relative to base region 112. In the case where bipolar transistor 110 is an NPN device, collector 106 and emitter 118 may be doped n-type to provide the two n-type active semiconductor materials and base 112 (including intrinsic base 112*a* and extrinsic base 112*b* thereof) may be doped p-type. Emitter 118 may include monocrystalline silicon and/or other monocrystalline semiconductor materials, including one or more materials used elsewhere in structure 100 to form subcollector 104, collector 106, extrinsic base 112*b* (with different doping), etc. One or more spacers 120 may be adjacent emitter 118 to structurally and electrically separate emitter 118 from extrinsic base 112*b* and/or contacts formed thereto. Spacer(s) 120 may include a nitride insulative material and/or any other insulative material discussed herein, e.g., insulator 108 or other insulating structures. Spacer(s) 120 be formed, e.g., by depositing a corresponding spacer material such that it covers any exposed surfaces and inner sidewalls of extrinsic base 112*b* before other materials (e.g., emitter 118) are formed over base 112. In some implementations, spacer(s) 120 may include a single layer or more than two layers.

To electrically couple bipolar transistor 110 to other devices and/or structures, a set of collector contacts 122 may extend through insulator 108 to collector extension region(s) 107, a set of base contacts 124 may extend through insulator 108 to extrinsic base(s) 112*b*, and one or more emitter contacts 126 may extend through insulator 108 to emitter 118. Contacts 122, 124, 126 may have similar or identical compositions, e.g., they may include conductive metals such as aluminum (Al), copper (Cu), gold (Au), etc. Contacts 122, 124, 126 thus may be distinguishable from each other solely based on the materials to which they connect, e.g., each contact 122 is on collector extension region 107, each contact 124 is on extrinsic base 122*b*, and each contact 126 is on emitter 118.

In structure 100, cavity 114 is located within insulator 108 and may be vertically between collector extension region 107 and extrinsic base 112*b*. That is, at least a portion of collector extension region 107 extends laterally below insulator 108 and cavity 114. Cavity 114 may include an air gap or otherwise may be defined as an area of space not having conductive material, semiconductive material, or any layer (s) of insulator 108 material therein. Cavity 114 may be formed at least partially by "pinching off" of insulator 108 material(s) as they are formed over collector extension region 107 (alternately, collector 106) and/or subcollector 104. In the context of forming an insulator, pinching off refers to a phenomenon in which forming of insulative material (e.g., second insulator 108*b* or other insulators discussed herein) through narrow space may leave open space (e.g., an air gap) in wider spaces that are separated from the rest of a structure by the narrow space. Other portions of insulator 108 may be adjacent cavity 114, and in some embodiments of the portion of insulator 108 adjacent cavity 114 may include second insulator 108*b* material (e.g., nitride insulators). Insulator 108 may be below notch 117 within extrinsic base 112*b*, such that notch 117 does not overlie cavity 114 along its horizontal length. For transistors used in radio frequency (RF) applications (e.g., bipolar junction transistors (BJTs) and, particularly, high performance heterojunction bipolar transistors (HBTs)), it is desirable to have a relatively high transit frequency $f_T$ and a relatively high maximum oscillation frequency $F_{max}$. $F_{max}$ is a function of $f_T$ and also of various parasitic variables, including parasitic resistances and parasitic capacitances. In the disclosed embodiments, parasitic resistance is reduced by the formation of a monocrystalline extrinsic base 112*b*. Additionally, in the disclosed embodiments, parasitic base-collector junction capacitance $C_{bc}$ is reduced by the presence of the cavity 114 between the extrinsic base 112*b* and the collector extension region 107 Reduction of these parasitic variables can result in a higher $F_{max}$ and thereby improved performance.

Figure 2:
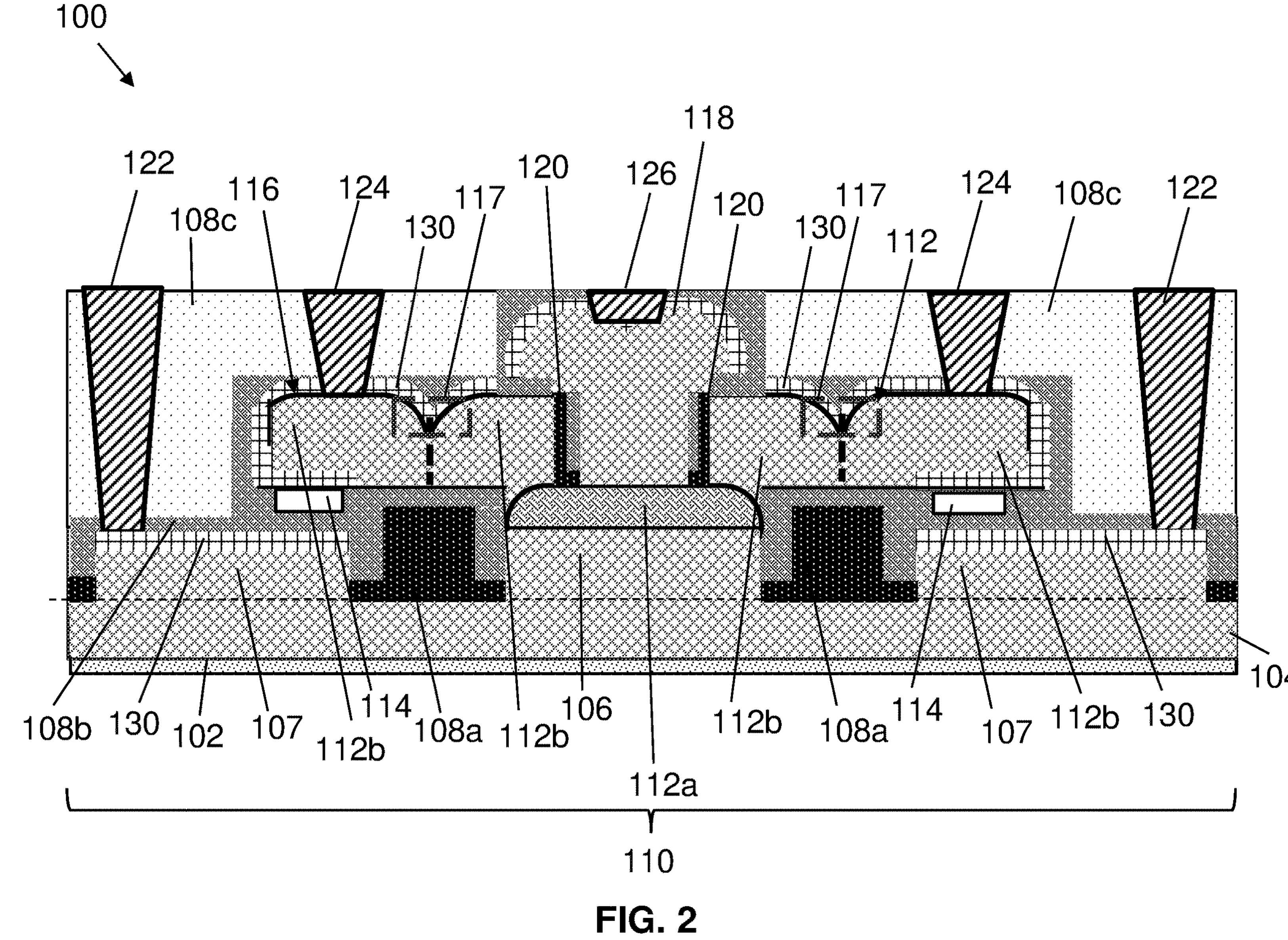
FIG. 2 depicts a cross-sectional view of a structure with optional conductive regions according to embodiments of the disclosure.

Referring to FIG. 2, a further example of structure 100 is provided according to embodiments. Structure 100 may include various additional or alternative materials for electrically separating various portions of bipolar transistor 110, but the presence and location of cavity 114 and notch 117 may be similar or unchanged throughout each implementation. Here, structure 100 may include one or more silicide regions 130 within portions of collector extension regions 107, extrinsic base 112*b*, and/or emitter(s) 118 to which contacts 122, 124, 126 connect. Silicide regions 130 may be formed on any semiconductor material defining collector extension regions 107, extrinsic base 112*b*, and/or emitter 118. For example, a conductive metal such as cobalt (Co), titanium (Ti), nickel (Ni), platinum (Pt), or similar material may be formed on collector extension regions 107, extrinsic base 112*b*, and/or emitter 118 and then may be annealed while in contact with the underlying semiconductor material to produce silicide region 130 for electrically coupling semiconductor materials to contacts 122, 124, 126 formed thereon. Excess conductive material can then be removed using any now known or later developed solution, e.g., etching. Each silicide region 130 may extend laterally below cavity 114 to insulator 108 such cavity 114 is vertically between silicide region 130 and extrinsic base 112*b*. The process(es) to form silicide regions 130, in any case, will not interfere with the presence of cavity 114 (i.e., no silicide material is formed therein) or notch 117 (i.e., silicide regions 130 may retain the shape of notch 117 when formed).

Figure 3:
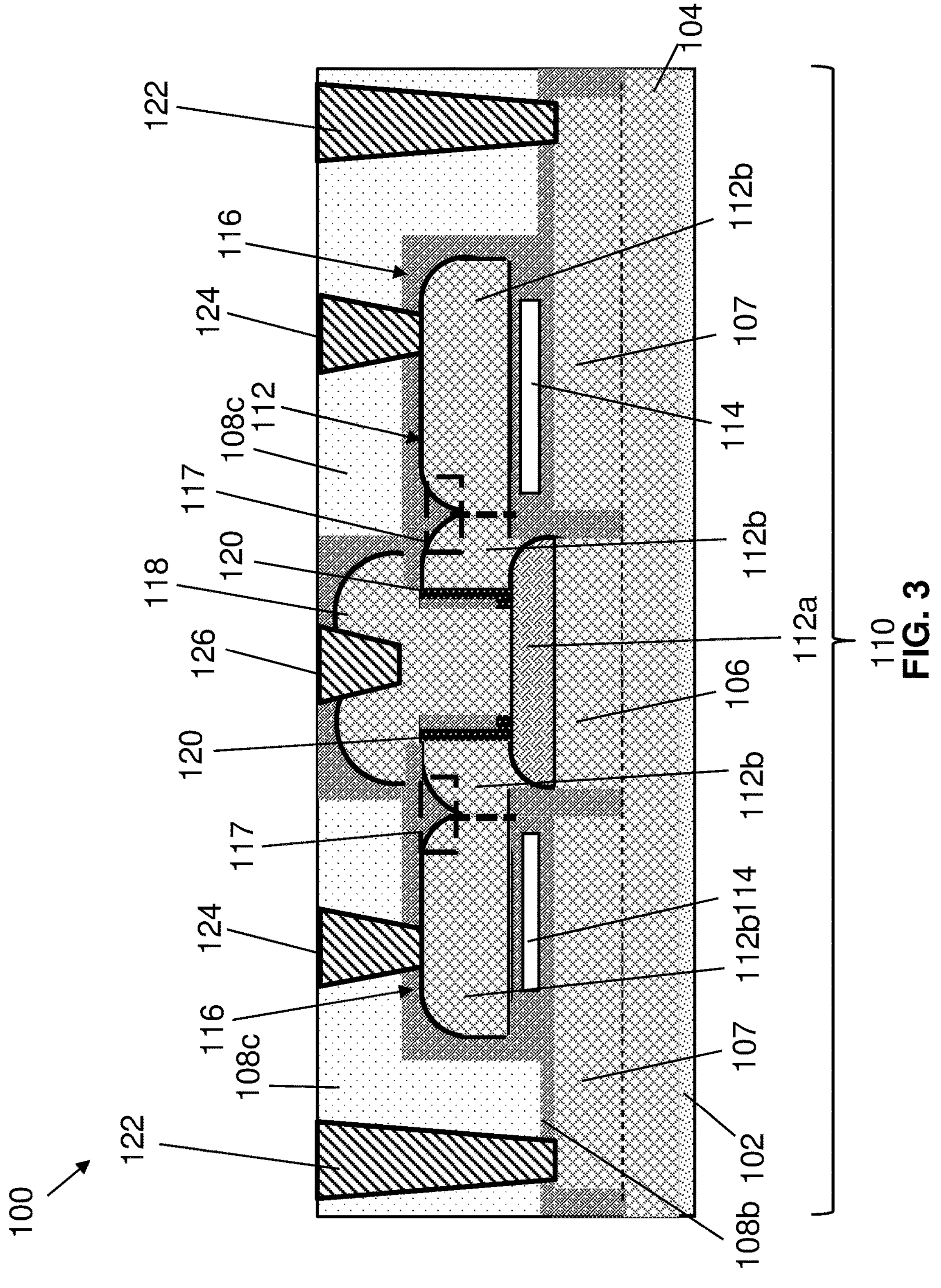
FIG. 3 depicts a cross-sectional view of a structure with optional conformal spacers according to embodiments of the disclosure.

FIG. 3 depicts a further implementation of structure 100 and bipolar transistor 110 in which insulator 108 includes second insulator 108*b* and third insulator 108*c*. Here, first insulator 108*a* (FIG. 1, 2) (e.g., TI material or another layer of oxide as discussed herein) is not present. In this case, portions of second insulator 108*b* may horizontally separate each portion of collector 106 from each other, without further separation via first insulator 108*a* as shown and described in other examples. Omitting first insulator 108*a*, in some cases, may cause cavity(ies) 114 to have a longer horizontal length below extrinsic base 112*b* than in other embodiments, e.g., due to the smaller amount of space to be filled with dielectric material. Cavity(ies) 114 nonetheless can form due to the presence of empty space between collector 106 regions that may be filled with second insulator 108*b* material. Notches 117 may be located over any portions of second insulator 108*b* that are horizontally between collectors 106, and thus cavity(ies) 114 may be vertically between collector 106 and extrinsic base 112*b* without being underneath any of notches 117.

Figure 4:
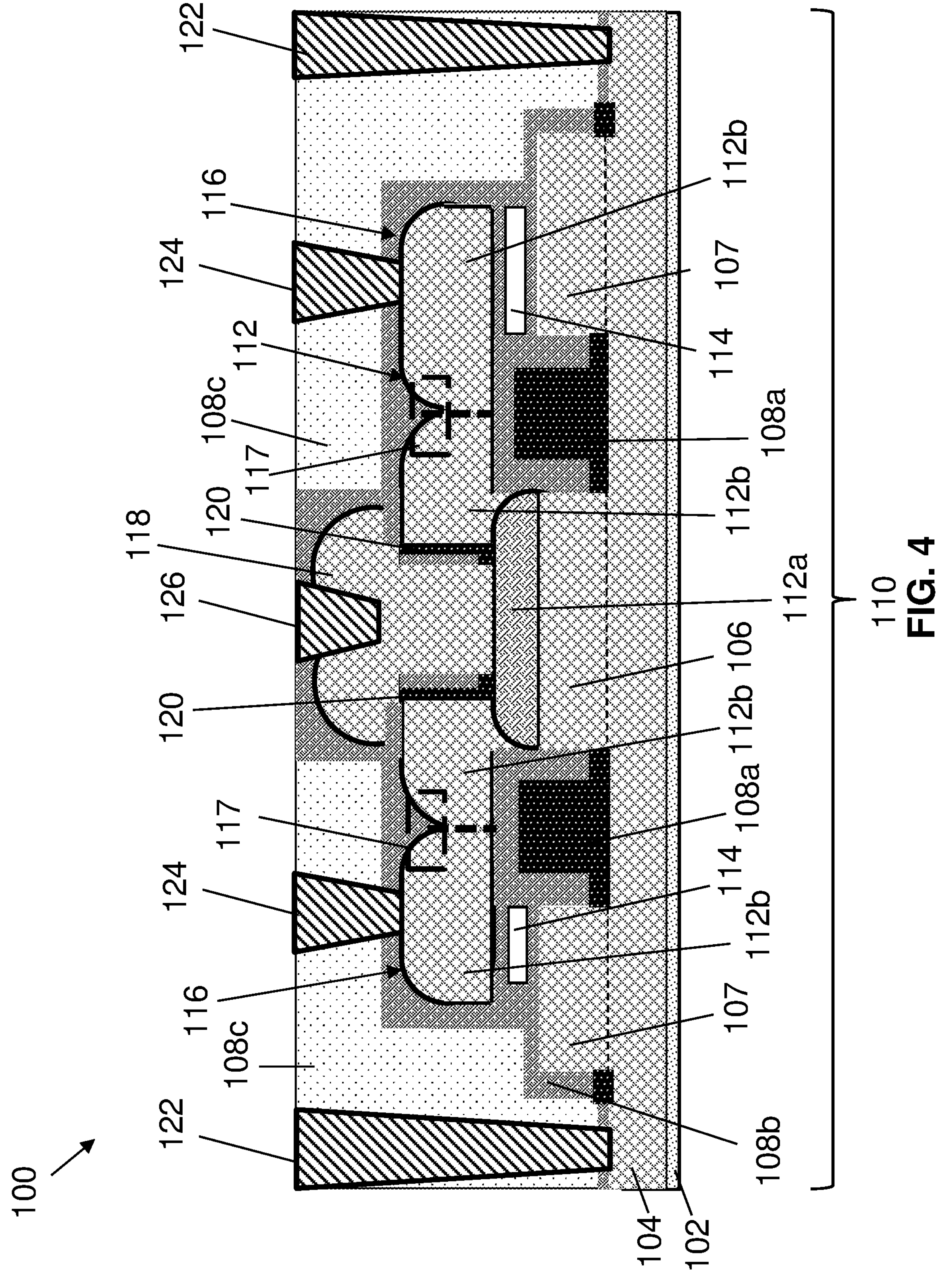
FIG. 4 depicts a cross-sectional view of a structure having contacts to a subcollector layer according to embodiments of the disclosure.

Referring to FIG. 4, some implementations of bipolar transistor 110 in structure 100 may include collector contacts 122 extending through insulator 108 to subcollector 104. Here, some collectors 106 and/or collector extension regions 107 may be epitaxially grown semiconductor material over subcollector 104 without any base material formed thereon. Regardless, collector extension region(s) 107 located between collector contact(s) 122 and collector 106 of bipolar transistor 110 may increase electrical conductivity between bipolar transistor 110 and collector contact(s) 122, e.g., by providing additional material that is more conductive than subcollector 104. To further control electrical conductivity between collector 106 and collector contact(s) 122, first insulator 108*a* of insulator 108 may define a TI region horizontally between collector 106 of bipolar transistor 110 and other collectors 106 or collector extension regions 107 that do not have base 112 thereon. Structure 100 otherwise may be similar or identical to other configurations discussed herein, and hence, cavity 114 may be horizontally between subcollector 104 (or collector(s) 106) and extrinsic base 112*b*, and notch 117 may be over a portion of insulator 108 that is horizontally adjacent cavity 114.

Figure 5:
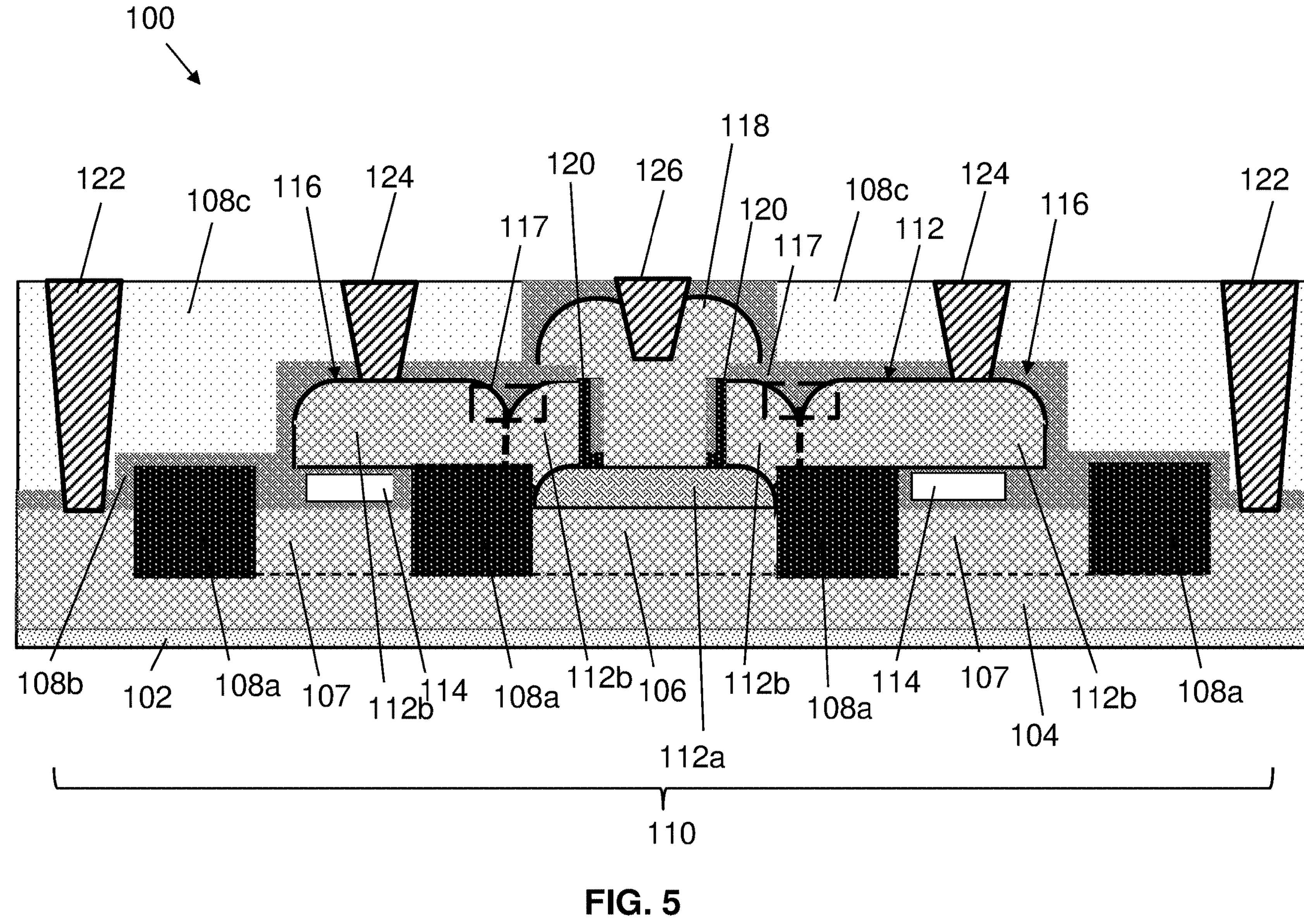
FIG. 5 depicts a cross-sectional view of a structure over a subcollector and with optional trench isolations (TIs) according to embodiments of the disclosure.

FIG. 5 depicts a further implementation of structure 100 in which certain first insulator(s) 108*a* may extend continuously vertically between subcollector 104 and extrinsic base 112*b*, and in which collector contacts 122 are coupled to subcollector 104. Each first insulator 106*a*, in this case, may take the form of a "TI spacer" with an upper surface that extends above collectors 106 and/or collector extension region(s) 107. Second insulator(s) 108*b* may be in the form of conformal spacers formed on bipolar transistor 110 and first insulators 108*a*, causing cavity 114 to be below extrinsic base 112*b* and adjacent first insulator(s) 108*a* due to the pinching off of spacer material. Thus, cavity 114 and notches 117 may have positions that are similar or identical to other embodiments of structure 100 discussed herein, despite the larger size of first insulator 108*a* as compared to other embodiments.

Figure 6:
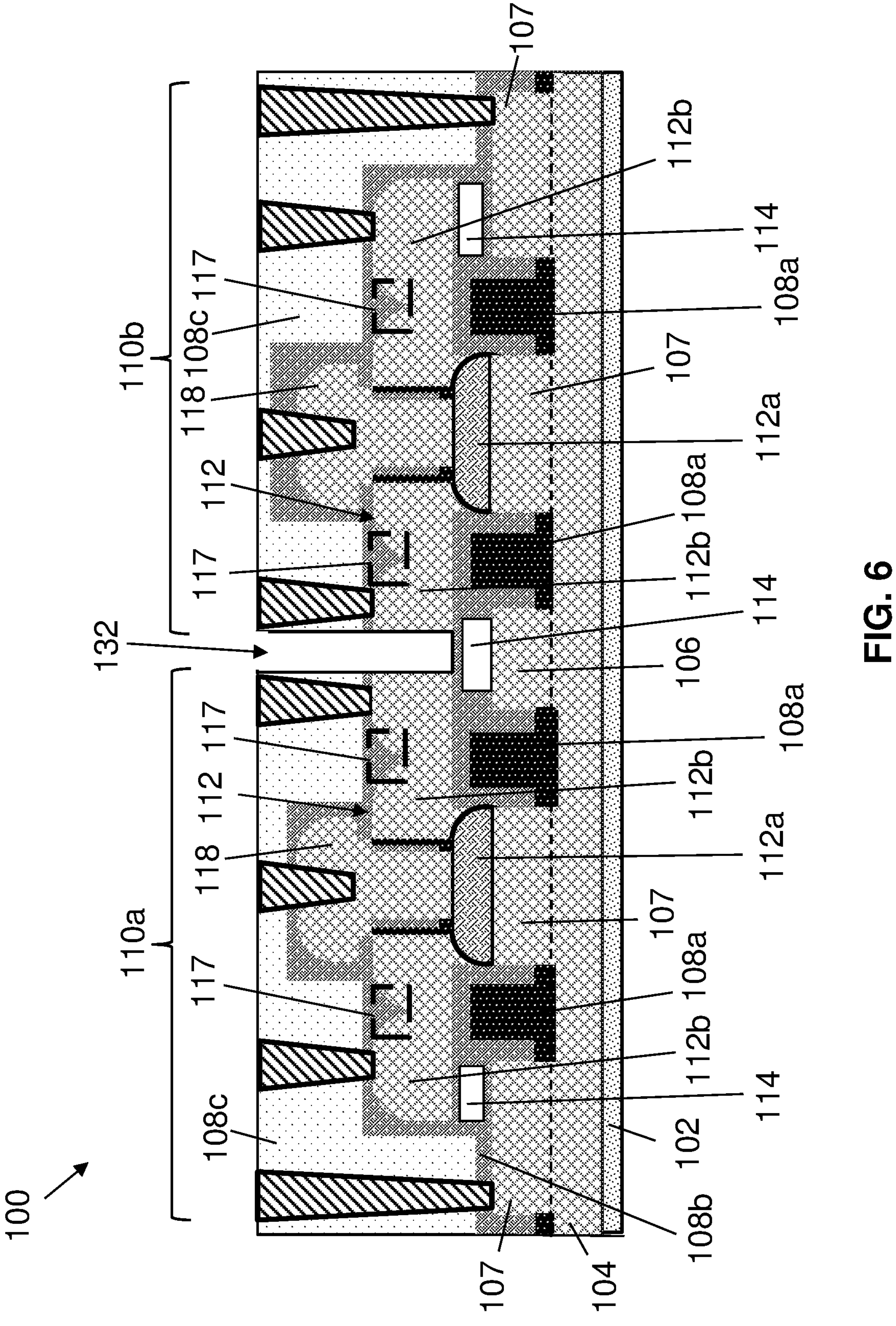
FIG. 6 depicts a cross-sectional view of a structure with a shared base according to embodiments of the disclosure.
Figure 7:
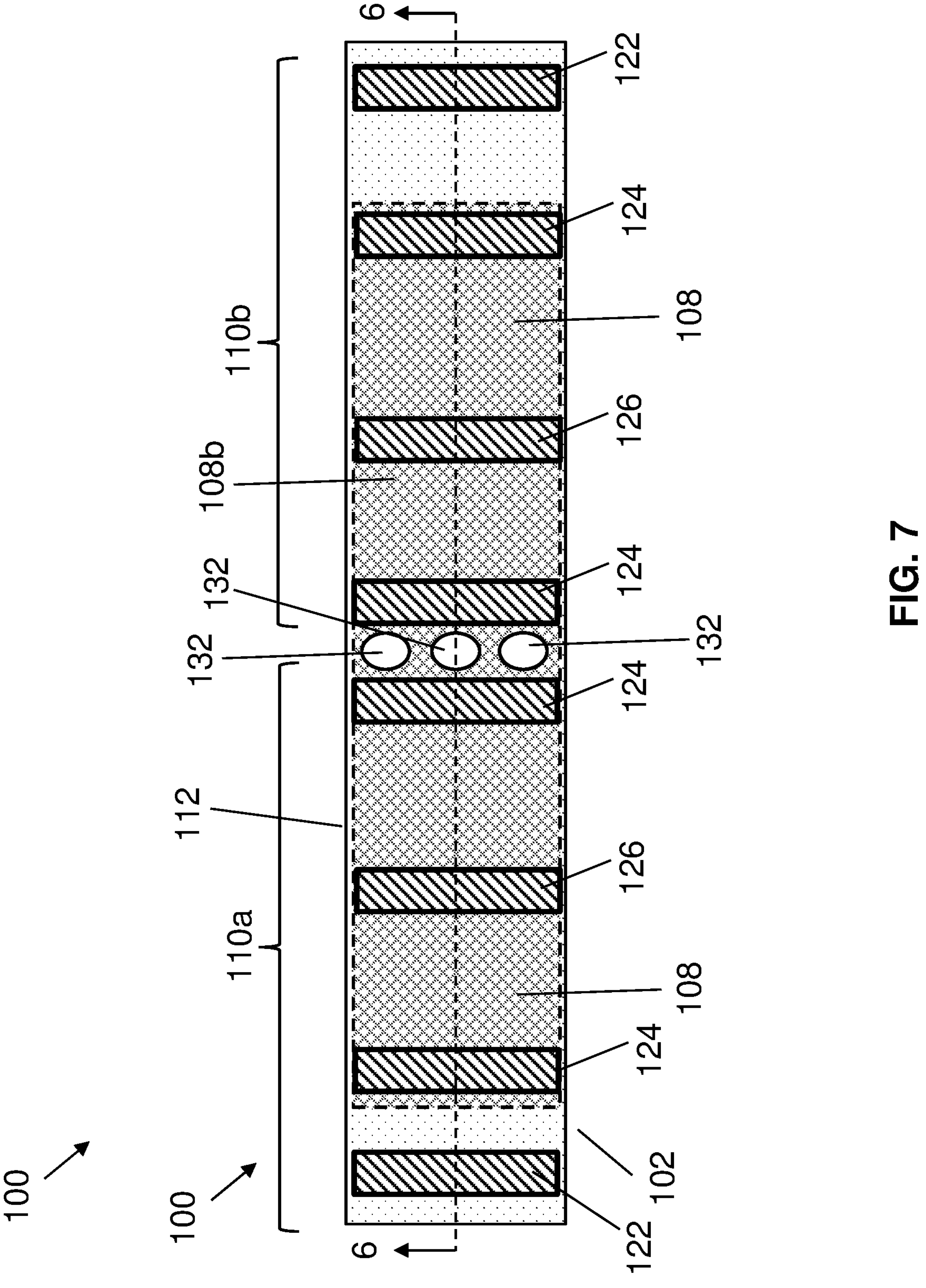
FIG. 7 depicts a plan view of a structure with a shared base according to embodiments of the disclosure.

As shown in FIGS. 6 and 7, structure 100 may include multiple bipolar transistors. FIG. 6 provides a cross-sectional view of structure 100 and FIG. 7 provides a plan view of structure 100. In structure 100, each base 112 of each bipolar transistor 110 is part of shared region of base material and may retain other structural aspects discussed herein relative to other embodiments (e.g., the presence of cavity(ies) 114 and notch(es) 117). According to embodiments (and as shown most clearly in FIG. 7), base 112 may extend horizontally above substrate 102 from one emitter 118 to another emitter 118. Each emitter 118 may be part of a different bipolar transistor 110 (separately labeled 110*a*, 110*b* in FIG. 6 for reference). Base 112 may include one or more voids 132 (also known as "etch access holes" or simply "holes") for laterally separating extrinsic base 112*b* in one bipolar transistor 110*a* from another extrinsic base 112*b* in the other bipolar transistor 110*b*. Although voids 132 extend through insulator 108 and extrinsic base 112*b*, they need not separate one extrinsic base 112*b* into structurally isolated regions. As shown in FIGS. 6 and 7, voids 132 may occupy significant space between extrinsic base 112*b* of each bipolar transistor 110*a*, 110*b*, but extrinsic base 112*b* nonetheless may have structural continuity between each bipolar transistor 110*a*, 110*b*. The size of voids 132 need only be large enough to impede electrical shorting from base 112 of one bipolar transistor 110*a* to the other bipolar transistor 110*b* and vice versa. The presence of voids 132, as indicated in FIG. 6, can also allow for insulators 108*a*, 108*b* to be formed over subcollector 104, collector 106, and/or collector extension region(s) 107 between bipolar transistors 110*a*, 110*b*, and cavity(ies) 114 may be formed beneath interconnected portions of base 112 in substantially the same manner as other embodiments described herein.

Figure 8:
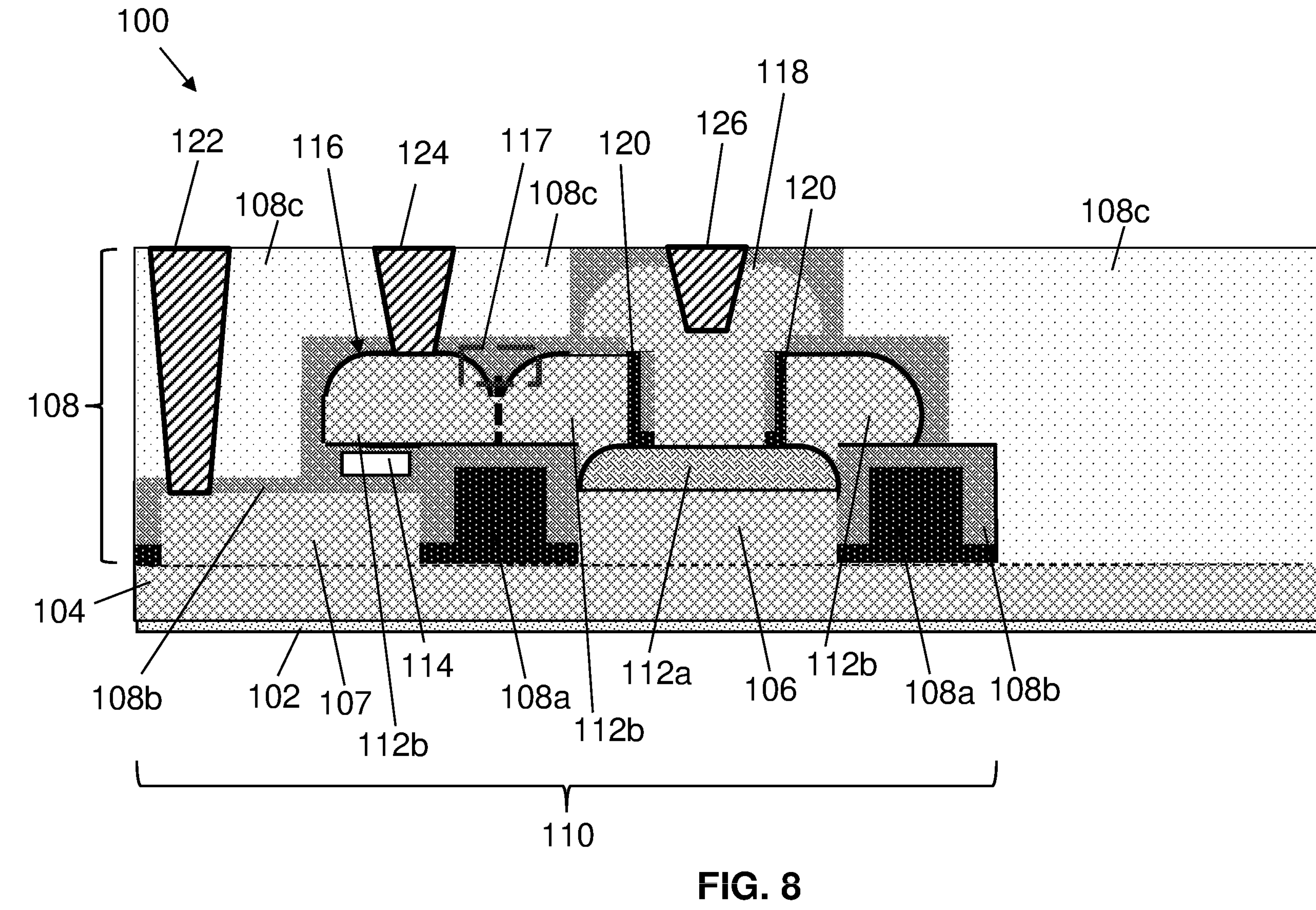
FIG. 8 depicts a cross-sectional view of a structure having a single base contact according to further embodiments of the disclosure.

FIG. 8 depicts a further implementation of structure 100, in which only one base contact 124 to extrinsic base 112 may be provided. Although other configurations of bipolar transistor 110 discussed herein may be symmetrical (e.g., they may include two extrinsic bases 112*b* each adjacent an opposite end of intrinsic base 112*a*), this is not necessarily required. In some cases, structure 100 may include only one cavity 114 below extrinsic base 112*b*, and only one notch 117 within extrinsic base 112*b* on the same portion extrinsic base 112*b*. Another portion of extrinsic base 112*b* may not include base contact 124 thereto, and thus may not have notch 117 and/or may not be located over a corresponding cavity 114. Extrinsic base(s) 112*b* without contacts thereto may be electrically inactive in bipolar transistor 110 and may appear solely as an artefact of processes to form other portions of extrinsic base 112*b*. Bipolar transistor 110 with only one base contact 124 to extrinsic base 112*b* may function similarly or identically to other bipolar transistors 110 and retains the various technical benefits of structure 100 due to the presence and locations of cavity 114 and notch 117 over at least one extrinsic base 112*b*.

Figure 9:
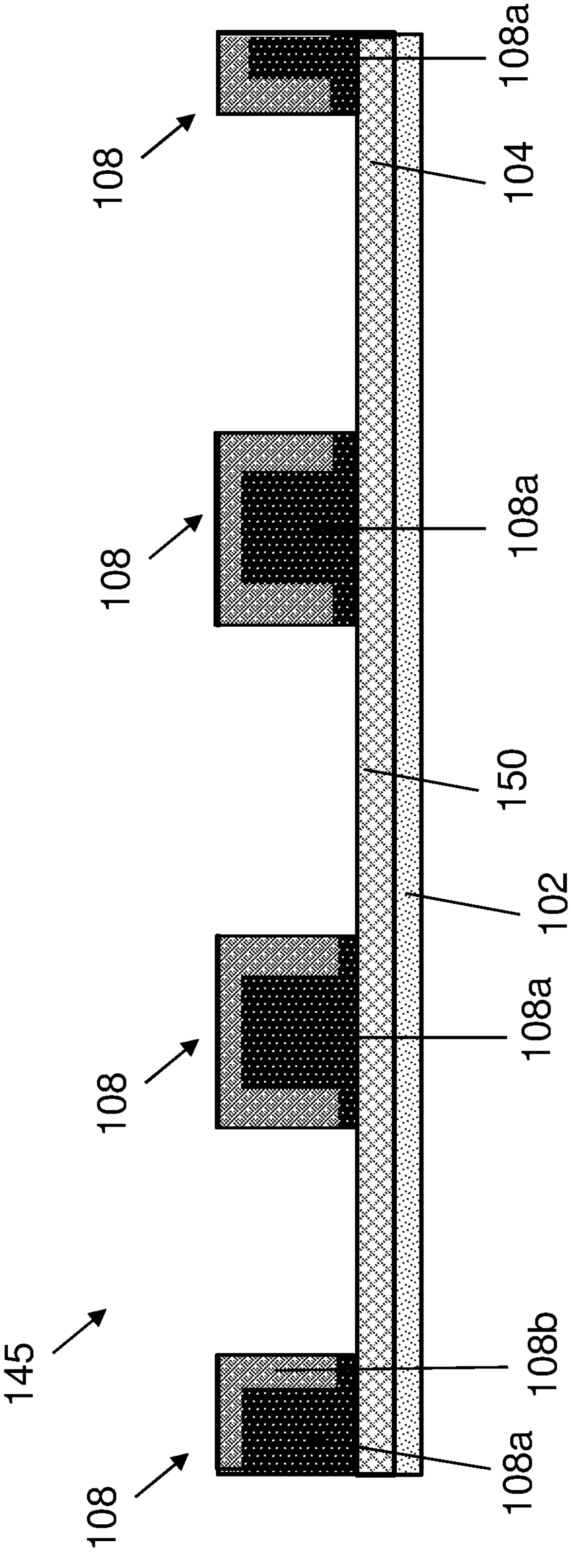
FIGS. 9-16 depict processes in methods to form a structure according to embodiments of the disclosure.

Embodiments of the disclosure also provide various methods to form structure 100. Such methods may be compatible with a variety of conventional processes to form vertically oriented bipolar transistors but may include certain modifications to provide cavity 114 below extrinsic base 112*b* and notch 117 within extrinsic base 112*b*. FIG. 9 depicts an initial structure 145 capable of being processed to yield embodiments of structure 100 discussed herein. Initial structure 145 may include a seed layer 150 of semiconductor material on substrate 102, in which seed layer 150 includes a doped semiconductor material (e.g., crystalline Si or alternatively a layer of SiGe) doped to have a particular polarity. According to an example, seed layer 150 may be doped n-type. Insulator(s) 108 may be on the upper surface of seed layer 150 at predetermined intervals, such that the space between individual regions of insulator 108 material allows seed layer 150 to be modified (e.g., by combinations of etching, epitaxial growth, deposition, etc.). Insulator(s) 108 may be formed by conventional techniques, e.g., depositing layers of insulative material and removing the deposited layer(s) with the aid of a temporary etch mask. Insulator(s) 108, in addition, may include first insulator 108*a* (e.g., an oxide insulator) on seed layer 150 and second layer 108*b* (e.g., a nitride insulator) on first insulator 108, in which each insulator 108*a*, 108*b* may have a distinct thickness.

Figure 10:
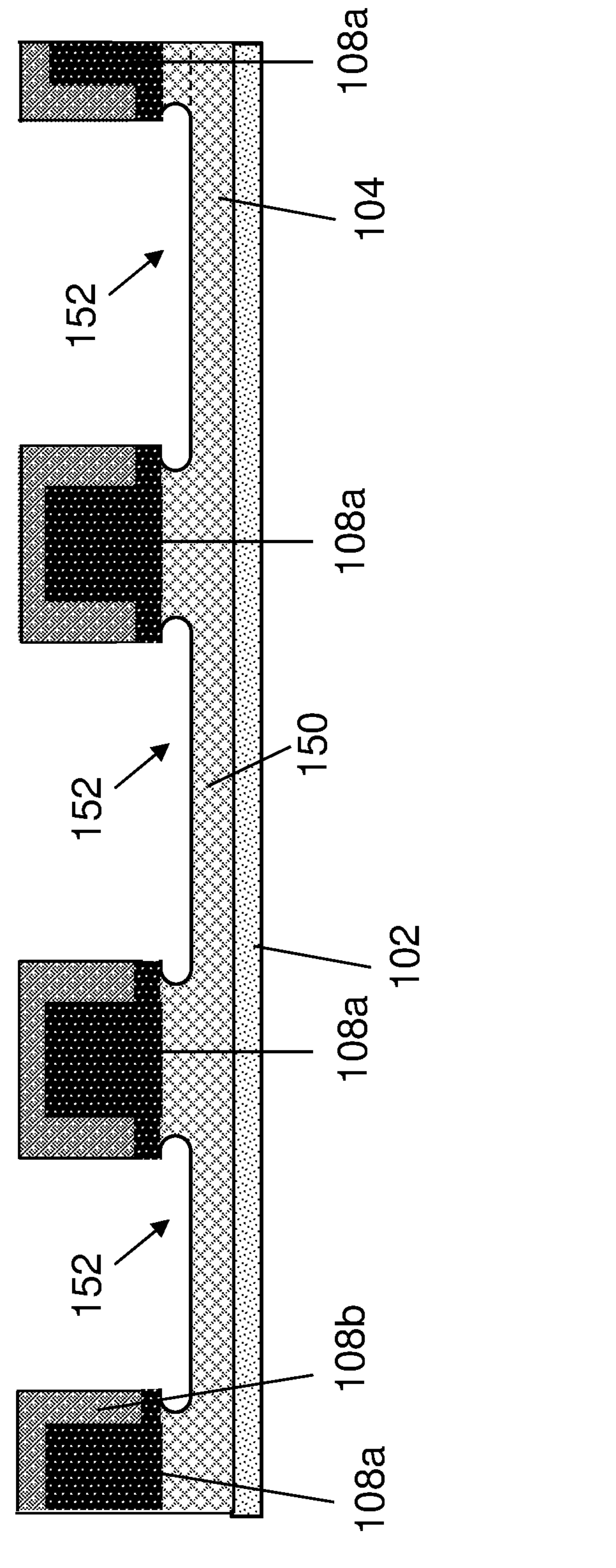

FIG. 10 depicts continued processing of seed layer 150, to enable forming of active material for a bipolar transistor. With insulator(s) 108 in place, seed layer 150 can be partially etched through the use of silicon-selective etchants and/or other etching techniques that will not affect insulator(s) 108. The use of such etchants will cause seed layer 150 to be removed in a downward direction, and a partially horizontally direction, to form a set of openings 152 within seed layer 150. Openings 152 may have a rounded shape suitable for growing crystalline semiconductor material thereon, e.g., using molecular beam epitaxy (MBE) or other processes for epitaxial growth.

Figure 11:
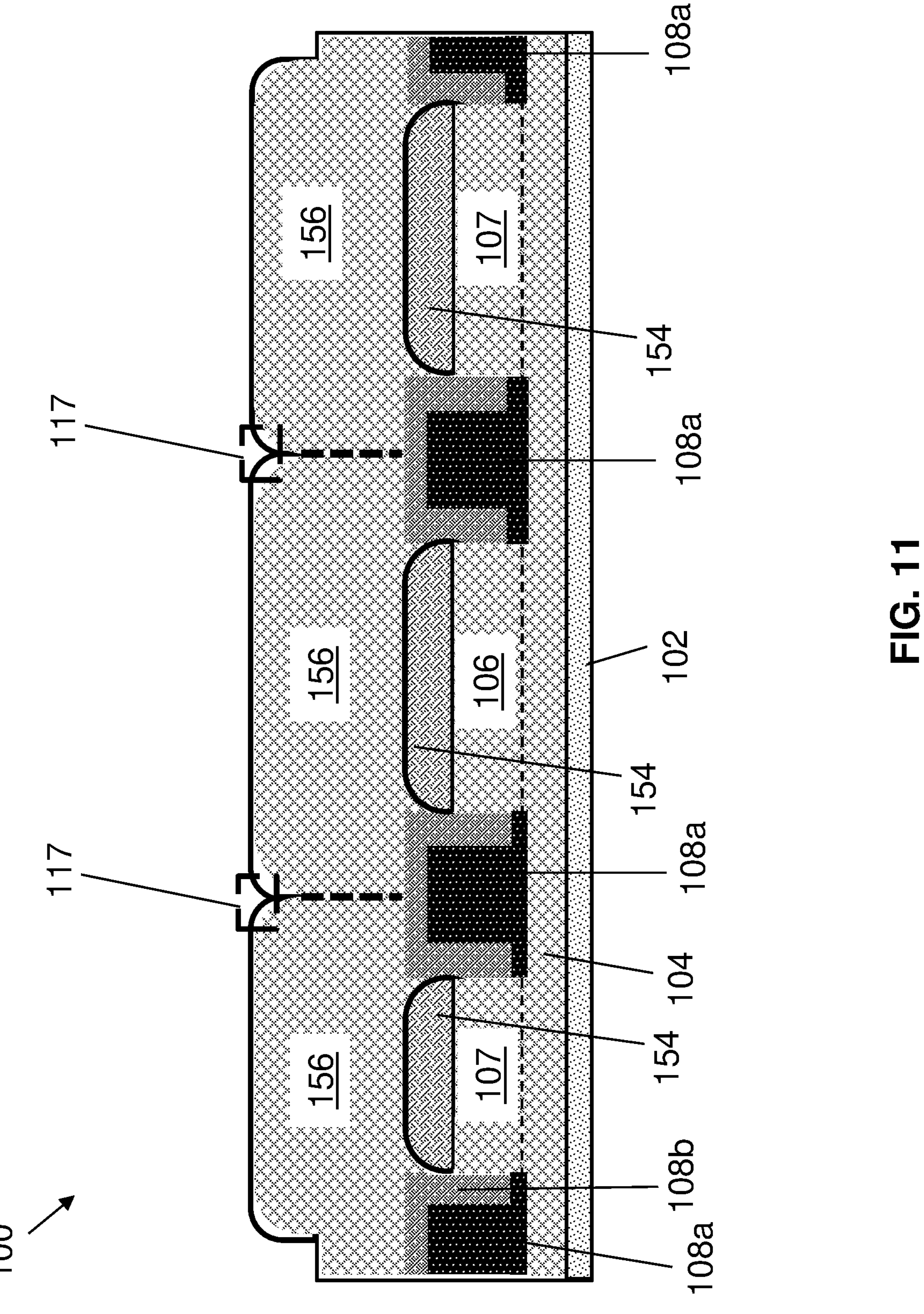

FIG. 11 depicts forming multiple areas of doped semiconductor material within openings 152 (FIG. 10). Collector(s) 106 and collector extension region(s) 107 may be formed by forming (e.g., by epitaxial growth) doped semiconductor material having the same polarity as seed layer 150 (FIGS. 9, 10) of initial structure 145. Collector(s) 106 and collector extension region(s) 107, once formed, may be distinguishable from subcollector 104 thereunder in that collector 106 is adjacent insulator(s) 108*a*, 108*b* whereas subcollector 104 is any remaining portion of seed layer 150 and/or other doped semiconductor material(s) that are beneath insulator(s) 108*a*, 108*b*. Continued processing may include forming a first base material 154 on collector(s) 106 and collector extension region(s) 107, e.g., by instead forming a semiconductor material having the opposite doping type from collector(s) 106 and collector extension region(s) 107. First base material 154 may include SiGe or other materials described herein suitable for use within base 112 (FIGS. 1-7) and may be doped p-type in the case where collector(s) 106 and collector extension region(s) 107 are n-type or vice versa. The forming of first base material 154 can be controlled, e.g., by controlling the amount of epitaxial growth and/or by subsequent planarization, such that the upper surface of first base material 154 is at most coplanar with the upper surfaces of adjacent insulator(s) 108, or otherwise located beneath the upper surface of adjacent insulator(s) 108. Further processing may include forming a second base material 156 on first base material(s) 154, e.g., by epitaxial growth of semiconductor material(s) having the same doping type as first base material 154. Where first base material(s) 154 includes SiGe, however, second base material 156 may have a different composition (e.g., it may be crystalline Si from being formed through epitaxial growth). Forming second base material 156 by epitaxial growth on multiple base materials 154 will initially cause three distinct regions of second base material 156 to form. As epitaxial growth continues, these regions may merge where indicated by dashed lines in FIG. 11. Due to the crystallographic interface between second base materials 156, notches 117 will form above the location of each crystallographic interface in second base material 156. As noted elsewhere herein, notches 117 may remain present in the eventual structure and may help to reduce the electrical resistance within the base terminal of a bipolar transistor.

Figure 12:
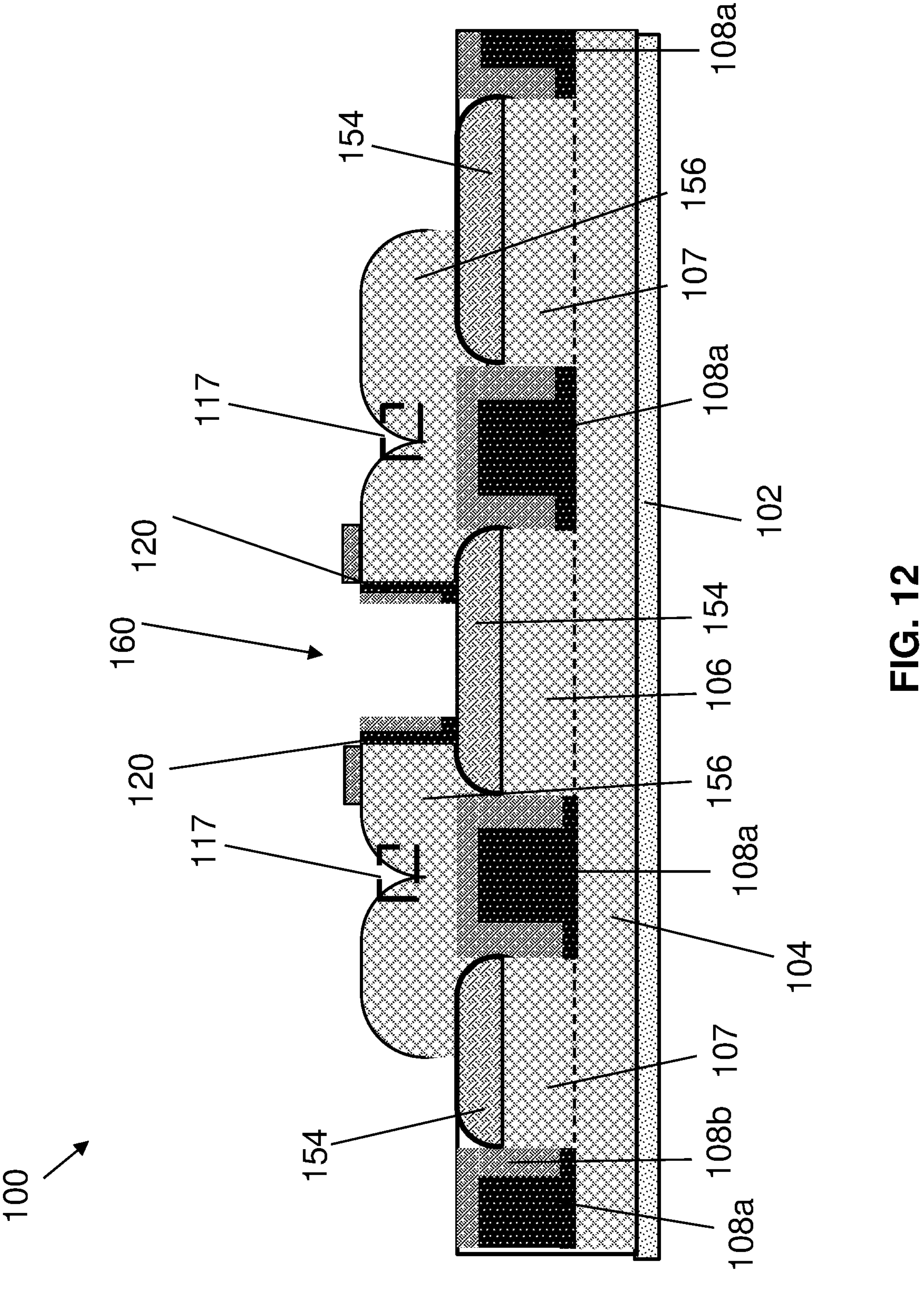

FIG. 12 depicts forming an opening 160 by removing a portion of second base material 156 to uncover a portion of first base material 154 thereunder. Other portions of first base material 154, however, remain covered by remaining portions of second base material 156 to provide the extrinsic base to intrinsic base connection in the eventual bipolar transistor structure. Upon removing a portion of second base material 156, a set of spacers 120 may be formed on the sidewalls of opening 160 and on adjacent upper surfaces of second base material 156. To maintain electrical conductivity from emitter to base in the eventual bipolar transistor, any spacer 120 material formed on first base material 154 may be removed by directional etching, such that first base material 154 remains at the bottom of opening 160 without a significant amount of spacer material 120 on its upper surface.

Figure 13:
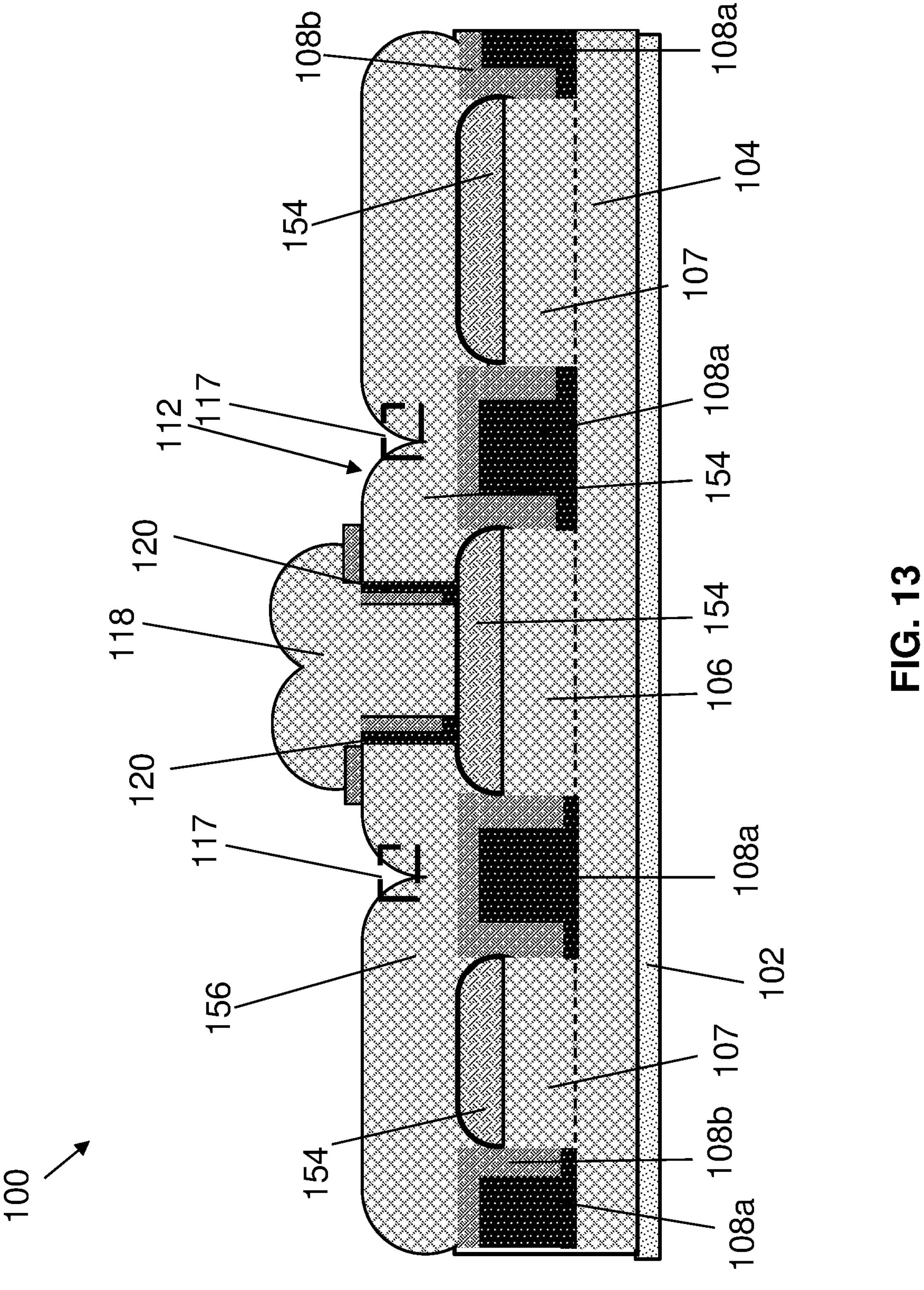

FIG. 13 depicts forming of additional epitaxial semiconductor material within opening 160 (FIG. 12) and elsewhere to form emitter 118, e.g., by further epitaxial growth of n-type semiconductor material(s) on first base material 154. The same epitaxial growth process(es) may form additional second base material 156 outside of spacers 120. The presence of notches 117 in earlier stages of processing may cause the forming of additional semiconductor material to retain the shape and size of notches 117 in second base material 156. In other implementations, second base material 156 may be covered with a masking material to prevent additional material(s) from being formed thereon as emitter 118 is formed within opening 160. Thus, forming additional second base material 156 as shown in FIG. 13 is not necessarily required in all implementations, and such material may be removed to define extrinsic base materials as discussed herein.

Figure 14:
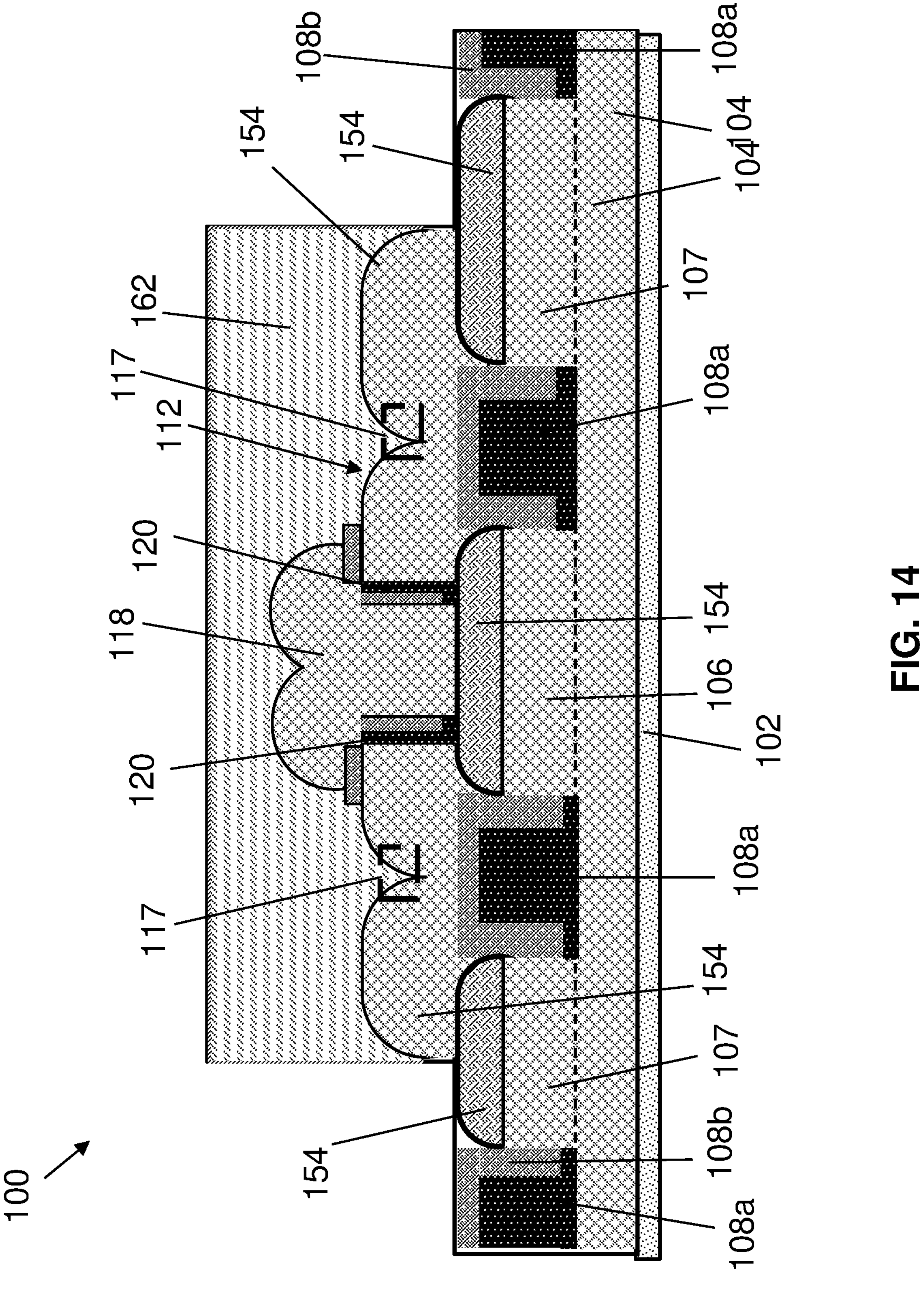

Turning to FIG. 14, further processing may include forming a masking layer 162 to cover second base material 156, spacer(s) 120, and emitter 118). Masking layer 162 may include any currently known or later developed photoresist material (e.g., one or more nitride based hard mask layers) having a predetermined horizontal width. Masking layer 162 may entirely cover emitter 118 and spacer(s) 120 but may not extend beyond the horizontal edge(s) of first base material(s) 154 not having emitter 118 thereover. As discussed elsewhere herein, this may allow some regions of first base material(s) 154 to be removed to create empty space vertically between collector(s) 106 and first base material 154. Portions of this empty space may be filled with dielectric material in subsequent processing, but this material may "pinch off" to create cavity(ies) 114 over collector(s) 106.

Figure 15:
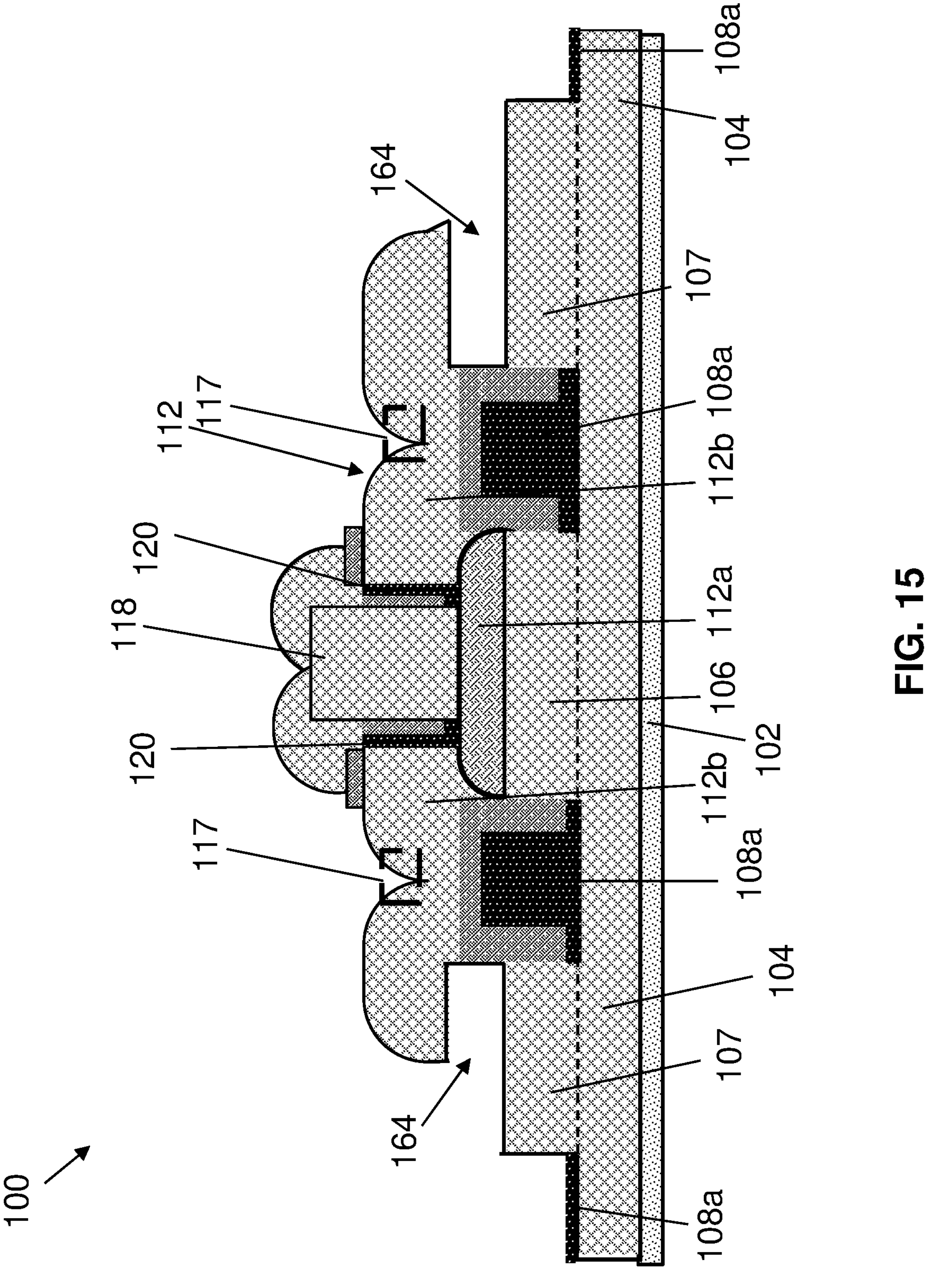

FIG. 15 depicts the further processes of removing exposed regions of first base material 154 (FIGS. 11-14) and second insulator 108*b* (e.g., by one or more instances of non-vertical or selective etching), and thereafter removing masking layer 162 (e.g., by stripping and/or any other technique to removing masking material(s) 162). The removing of first base material(s) 154 may create undercut openings 164 vertically between collector 106 and extrinsic base(S) 112*b*. Any portions of first base material 154 located below masking layer 162, and hence not removed, may become intrinsic base 112*a* vertically between collector 106 and emitter 118. In addition, first insulator(s) 108*a* may remain intact over subcollector 104 despite the removing of first base material 154 and/or second insulator 108*b* (e.g., due to non-selectivity of etchants to the first insulator 108*a* composition). Undercut openings 164, when filled with insulator material(s) as discussed herein, may be narrow enough (e.g., vertical span of up to approximately fifty nanometers (nm)) to induce "pinch off" and create cavity(ies) 114 therein.

Figure 16:
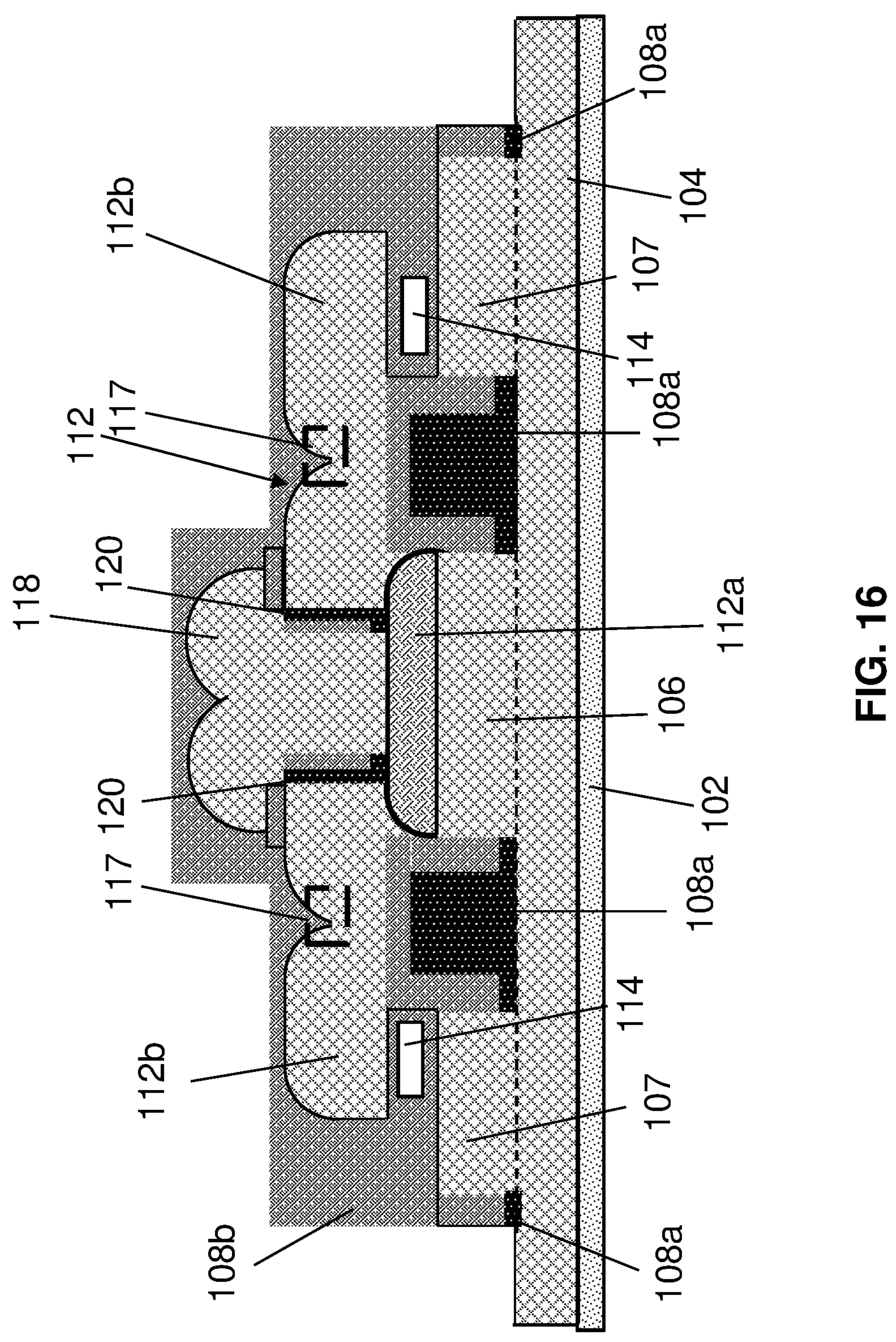

FIG. 16 depicts the forming (or re-forming, where applicable) of second insulator 108*b* over extrinsic bases 112*b*, spacers 120, emitter 118, and vertically between collector(s) 106 and extrinsic base 112*b*. Second insulator 108*b* may be formed through a combination of deposition and etching, in which portions of second insulator 108*b* horizontally beyond collector extension regions 107 may be removed from the upper surface of subcollector 104 material. The forming of second insulator 108*b* may cause its composition (e.g., nitride-based insulator materials or other fillable dielectric materials) to pinch off cavity(ies) 114, leaving it/them unfilled even as additional second insulator 108*b* material is formed. Additional second insulator material 108*b* may encapsulate extrinsic bases 112*b*, emitter 118, and/or spacer(s) 120 to create a formal spacer structure over the various materials discussed herein. In still further implementations, second insulator material 108*b* may be used solely to form cavity(ies) 114 and not to encapsulate any other materials. Further processing to yield structure(s) 100 (FIGS. 1-8) may include forming ILD material (e.g., third insulator 108*c* (FIGS. 1-8), forming openings in ILD material and filling them with conductor(s) to form contact(s) 122, 124, 126 (FIGS. 1-8), and/or other processes suitable to yield bipolar transistor 110 (FIGS. 1-8) discussed herein). In various further implementations, it is possible for the forming of bipolar transistor 110 to be implemented before the forming of cavity(ies) 114 by changing the order of processes described herein and/or implementing various conventional processes to form bipolar transistor 110 in a different order. In still further examples, methods of the disclosure may be modified to omit certain steps and/or not perform certain steps on multiple areas, e.g., only one extrinsic base 112*b* and cavity 114 (as shown in FIG. 8) may be formed by performing the methods discussed herein over a reduced surface area.

Embodiments of the disclosure provide various technical and commercial advantages, examples of which are discussed herein. Embodiments of the disclosure are operable to form cavity(ies) 114, e.g., air gaps, at electrically inactive locations that are vertically between the extrinsic base(s) and collector materials for a vertical bipolar transistor. Such cavity(ies) 114, during operation, will improve the electrical isolation between base and collector terminals that are otherwise in relatively close proximity with each other. These benefits may be enhanced through the presence of notch(es) 117 within the extrinsic base, particularly where notch(es) 117 are not vertically above and/or aligned with cavity(ies) 114. Among other benefits, the improved electrical isolation reduces resistance within the base terminal of a transistor and enables better growth of crystalline extrinsic base material than may be possible in conventional vertical bipolar transistors. Related technical benefits may include, e.g., reduction in parasitic capacitance between the base material(s) and other active portions of a bipolar transistor.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:

a bipolar transistor structure including an extrinsic base protruding from an intrinsic base of the bipolar transistor structure, wherein an upper surface of the extrinsic base includes a notch;

an insulator below a portion of the extrinsic base, wherein a collector extension region of the bipolar transistor structure extends laterally below the insulator; and a cavity encapsulated within the insulator, wherein the cavity is vertically between the collector extension region and the portion of the extrinsic base, and horizontally offset from the notch.

2. The structure of claim 1, wherein the extrinsic base includes a monocrystalline semiconductor.

3. The structure of claim 1, wherein the collector extension region includes a silicide region extending laterally below the cavity to the insulator such the cavity is vertically between the silicide region and the extrinsic base.

4. The structure of claim 1, wherein the insulator includes:

a nitride encapsulating the cavity, and an oxide below a portion of the nitride and adjacent a portion of the collector.

5. The structure of claim 4, wherein the oxide includes a lower portion adjacent the collector and an upper portion between the nitride and the intrinsic base.

6. The structure of claim 1, further comprising a void within the extrinsic base above the insulator, wherein the void electrically separates an emitter of the bipolar transistor structure from an adjacent emitter.

7. The structure of claim 1, further comprising a spacer material within the notch on the upper surface of the extrinsic base.

8. A structure comprising:

a vertical bipolar transistor structure including:

a collector on a substrate, an intrinsic base on the collector, an extrinsic base protruding from the intrinsic base, wherein an upper surface of the extrinsic base includes a notch, and an emitter on a portion of the intrinsic base;

an insulator below a portion of the extrinsic base, wherein a collector extension region of the bipolar transistor structure extends laterally below the insulator; and a cavity encapsulated within the insulator, wherein the cavity is vertically between the collector extension region and the portion of the extrinsic base, and horizontally offset from the notch.

9. The structure of claim 8, wherein the intrinsic base includes silicon germanium (SiGe), and wherein the extrinsic base includes a monocrystalline semiconductor.

10. The structure of claim 8, wherein the collector includes a silicide region extending laterally below the cavity to the insulator such the cavity is vertically between the silicide region and the extrinsic base.

11. The structure of claim 8, wherein the insulator includes:

a nitride encapsulating the cavity, and an oxide below a portion of the nitride and adjacent a portion of the collector.

12. The structure of claim 11, wherein the oxide includes a lower portion adjacent the collector and an upper portion between the nitride and the intrinsic base.

13. The structure of claim 8, further comprising a void within the extrinsic base above the insulator, wherein the void electrically separates an emitter of the vertical bipolar transistor structure from an adjacent emitter.

14. The structure of claim 8, further comprising a silicide material on an upper surface, a sidewall, and a lower surface of the extrinsic base.

15. A method comprising:

forming a bipolar transistor structure including an extrinsic base protruding from an intrinsic base of the bipolar transistor structure, wherein an upper surface of the extrinsic base includes a notch;

forming an insulator and below a portion of the extrinsic base, wherein a collector extension region of the bipolar transistor structure extends laterally below the insulator; and forming a cavity encapsulated within the insulator, wherein the cavity is vertically between the collector extension region and the portion of the extrinsic base, and horizontally offset from the notch.

16. The method of claim 15, further comprising forming a silicide region within the collector, the silicide region extending laterally below the cavity to the insulator such the cavity is vertically between the silicide region and the extrinsic base.

17. The method of claim 15, wherein forming the insulator includes:

forming a nitride to encapsulate the cavity, and forming an oxide below a portion of the nitride and adjacent a portion of the collector.

18. The method of claim 17, wherein the oxide includes a lower portion adjacent the collector and an upper portion between the nitride and the intrinsic base of the bipolar transistor structure.

19. The method of claim 15, wherein forming the insulator includes forming a spacer material to fill the notch within an upper surface of the extrinsic base.

20. The method of claim 15, further comprising forming a void within the extrinsic base above the insulator, wherein the void electrically separates an emitter of the bipolar transistor structure from an adjacent emitter.

* * * * *